United States Patent
Pascucci et al.

(10) Patent No.: US 6,920,066 B2
(45) Date of Patent: Jul. 19, 2005

(54) PROGRAMMING METHOD OF THE MEMORY CELLS IN A MULTILEVEL NON-VOLATILE MEMORY DEVICE

(75) Inventors: Luigi Pascucci, Sesto San Giovanni (IT); Paolo Rolandi, Voghera (IT); Marco Riva, Lallio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 140 days.

(21) Appl. No.: 10/438,175

(22) Filed: May 13, 2003

(65) Prior Publication Data

US 2004/0037144 A1 Feb. 26, 2004

(30) Foreign Application Priority Data

May 13, 2002 (EP) .............................. 02425293

(51) Int. Cl.[7] .............................................. G11C 16/04
(52) U.S. Cl. .............................. 365/185.03; 365/185.17
(58) Field of Search ....................... 365/185.03, 185.17, 365/185.18, 185.19, 185.24

(56) References Cited

U.S. PATENT DOCUMENTS

| | | | | |
|---|---|---|---|---|
| 5,553,020 A | | 9/1996 | Keeney et al. | 365/185.19 |
| 5,555,521 A | * | 9/1996 | Hamada et al. | 365/185.03 |
| 5,708,600 A | | 1/1998 | Hakozaki et al. | 365/185.03 |
| 5,790,454 A | * | 8/1998 | Choi | 365/185.03 |
| 5,796,652 A | | 8/1998 | Takeshima et al. | 365/185.03 |
| 5,831,901 A | | 11/1998 | Tang et al. | 365/185.03 |
| 5,970,012 A | | 10/1999 | Takeshima | 365/230.01 |
| 6,404,679 B1 | * | 6/2002 | Guedj | 365/185.03 |
| 6,545,909 B2 | * | 4/2003 | Tanaka et al. | 365/185.03 |
| 6,807,097 B2 | * | 10/2004 | Takano et al. | 365/185.03 |
| 2002/0064070 A1 | | 5/2002 | Yamazaki et al. | 365/185.03 |

FOREIGN PATENT DOCUMENTS

JP 2002/124091 4/2002

OTHER PUBLICATIONS

Ohkawa, M., et al., "A 98mm2 Die Size 3.3–V 64–Mb Flash Memory with FN–NOR Type Four–Level Cell," *IEEE Journal of Solid–State Circuits* 31(11):1584–1589, Nov. 1996.

* cited by examiner

Primary Examiner—Trong Phan
(74) Attorney, Agent, or Firm—Lisa K. Jorgenson; Robert Iannucci; Seed IP Law Group PLLC

(57) ABSTRACT

A method for programming a non-volatile memory device of the multi-level type, includes a plurality of transistor cells grouped into memory words and conventionally provided with gate and drain terminals. The method applies different drain voltage values at different threshold values. Such values are directly proportional to the threshold levels to be attained by the individual memory word bits, and effective to provide for a simultaneous attainment of the levels, in a seeking-to manner, of the levels at the end of a limited number of pulses. Advantageously, a constant gate voltage value is concurrently applied to the gate terminals of said cells, such that the cell programming time is unrelated to the threshold level sought.

30 Claims, 6 Drawing Sheets

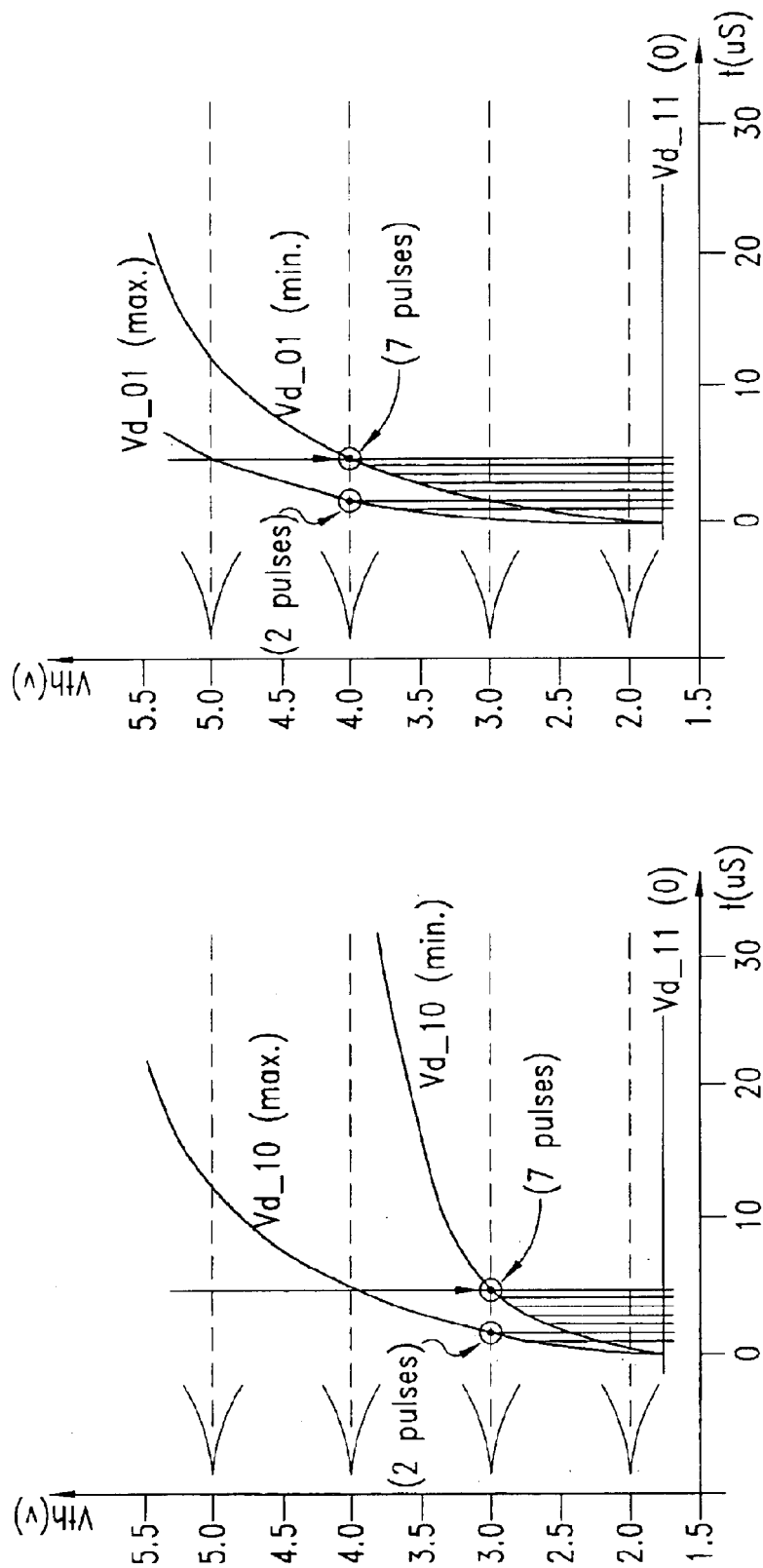

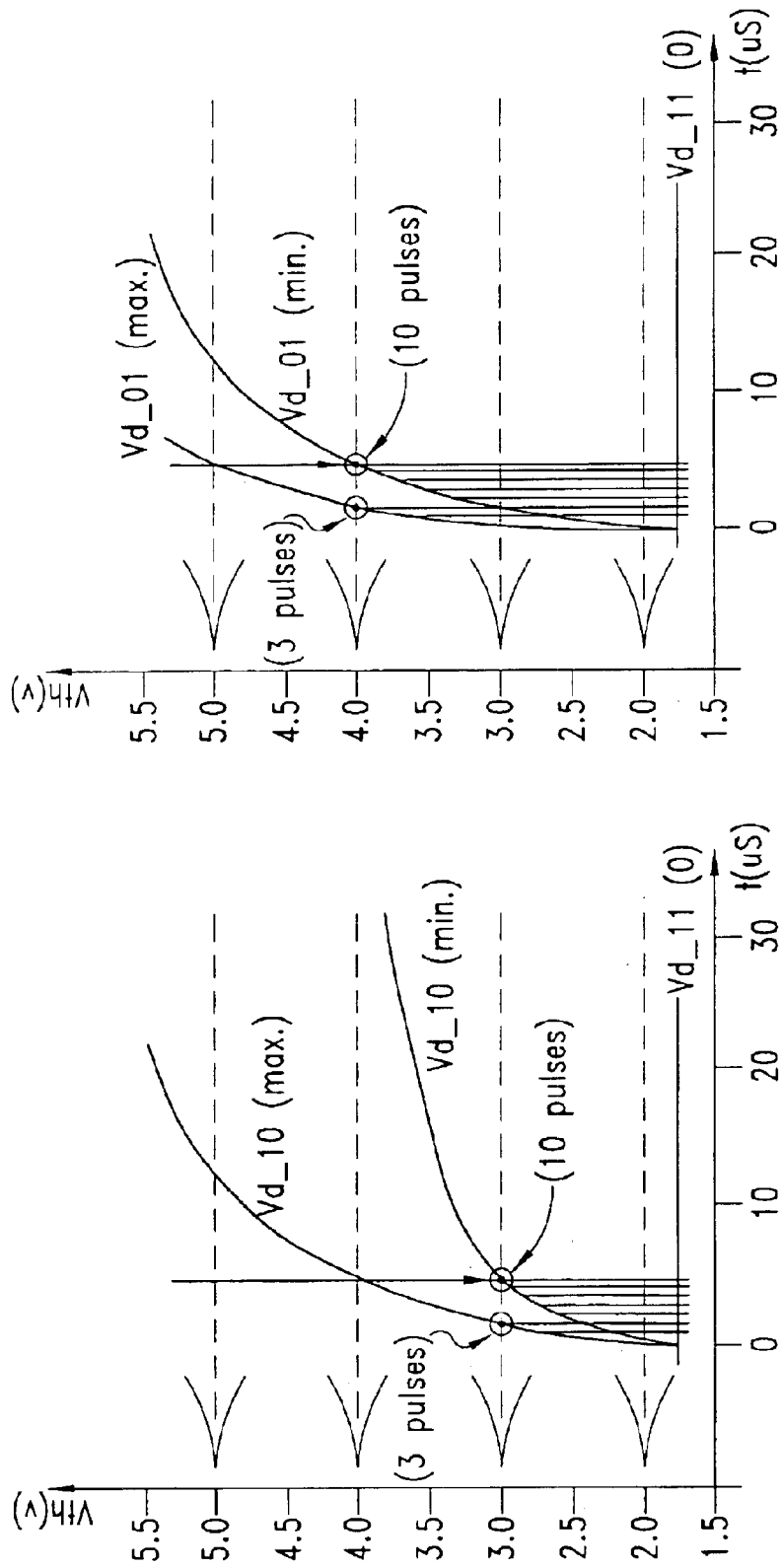

PROGRAMMING METHOD OF THE MEMORY CELLS IN A MULTILEVEL NON-VOLATILE MEMORY DEVICE

BACKGROUND OF THE INVENTION

1. Field of the Invention

The present invention relates to a method for programming the memory cells of a multi-level non-volatile memory device.

More particularly, the invention relates to a method of programming a non-volatile memory device of the multi-level type, which device comprises a plurality of transistor cells grouped into memory words and provided with conventional gate and drain terminals.

The invention relates, particularly but not exclusively, to a multi-level non-volatile memory device monolithically integrated in a semiconductor, and the following description is made with reference to this application field for convenience of illustration only.

2. Description of the Related Art

As it is well known, in a two-level memory device that employs a floating gate MOS transistor as elementary cell, the threshold voltage of the cell can be modulated to establish either of two logic states. A first logic state (logic "1") corresponds to a situation of the floating gate containing no charge, as is typical of a virgin or an erased cell, for example. Another logic state (logic "0") corresponds to the floating gate storing a sufficient number of electrons to produce a dramatic rise of its threshold, thereby denoting the programmed state of the cell.

A current-read method can be used for reading a memory cell 1, which consists of applying a read voltage Vread to the gate terminal of the cell and reading the current that flows through the cell:

if the cell is a written cell, its threshold voltage will be higher than the read voltage Vread, so that no current will flow through the cell; otherwise if the cell is an erased cell, its threshold voltage must be adequate to admit a current through the cell.

To read information contained in memory cells of this type, a sense amplifier is used which compares the cell current with a reference value, thus converting the analog information of the addressed data in the cell, i.e. the value of the cell threshold voltage, to digital information, i.e. to a logic "0" or a logic "1".

Non-volatile memory devices, particularly those of the EEPROM and FLASH types, are specially adapted to store large amounts of data, and are widely used, for example, in the presently expanding digital video and audio fields. In fact, digital video and audio applications require higher and higher storage capacities in order to store a large number of musical songs in the same support, or to enhance image quality, such as by an increased number of imaging pixels.

Multi-level non-volatile memories have recently appeared on the market, which are memories capable of storing a multiplicity of information bits in each cell. Such memories look specially well equipped to fill the above demands.

In this type of multi-level memories, the charge stored in the floating gate is further broken up, thereby generating a number $2^{nb}$ of distributions, where "nb" is the number of bits that are to be stored in a single cell. For example, with 2 bits per cell, the read sense amplifier is to process four distributions, instead of two as in the two-level instance.

A comparison of the threshold voltage distribution for a two-level (0,1) memory and a multi-level (00,01,10,11) memory with two bits per cell is schematically illustrated in FIGS. 4A and 4B. It can be seen that the multi-level structure decreases the gap between the voltage values and increases the read voltage.

It should be noted that the working range of the threshold voltage is independent of the number of bits contained in the cell. Thus, by employing a multi-level structure, the threshold gap between the various distributions decreases.

Reducing the gap between the threshold voltage distributions means reducing the current differences that the sense amplifier is to sense. Furthermore, it should be provided a programming method, able to place the cells inside the various distributions.

For convenience of illustration only, the instance of a flash EEPROM with NOR architecture will be considered herein below.

As it is well known, memory cells of this type are written by hot electron injection, by applying a voltage of about 10 V to the control gate terminal, a voltage of about 5 V to the drain terminal, and by leaving the source terminal connected to a ground reference, thereby allowing the floating gate terminal to accumulate charge to saturation.

In the instance of a multi-level memory, the reduction of the difference between the threshold voltages corresponding to the various charge levels that can be stored in the floating gate terminal, and hence the difference between the various conduction levels of the cells, requires an accurate and "fine" control of the cell programming operation, and in particular of the charge stored in the floating gate terminal during such an operation.

It has been shown, both theoretically and experimentally, that a linear relation exists between the variation $\Delta VG$ of the voltage applied to the control gate terminal during the cell programming phase and the threshold jump that is obtained at set values of the voltage VD applied to the drain terminal and of the voltage VS to the source terminal, as explained by Riccò et al. in an article "Nonvolatile Multilevel Memories For Digital Application", Pro. IEEE, vol. 86, December, 1998, pages 2399–2421, which is incorporated herein by reference in its entirety.

In particular, as schematically shown in FIG. 1, the cell should be programmed by applying, to its control gate terminal, a "stepwise" voltage that increases linearly and applying a constant voltage (Vd1=Vd2=Vd3=Vd4=Vd5=Vd6=Vd7) to the drain terminals.

In practice, a series of program pulses are used which differ from each other by a constant value $\Delta VG$. Thus, the program voltage is a constant pitch stepwise ramp, while the voltage on the drain terminal and the pulse duration are dependent on and set by the cell fabrication process.

At the end of each program pulse, the result is verified to see if the desired threshold level has been attained, and to discontinue or to continue programming accordingly.

It can be appreciated that, when this programming method is used, a threshold voltage distribution of width $\Delta VG$ is obtained, which equals the pitch of the stepwise program voltage.

Thus, multi-level memory cells can be programmed at a desired threshold voltage by using a predetermined number of program pulses.

The main problem encountered with the above method is its inherently low speed. Programming multi-level cells involves applying a succession of pulses to the control gate of the cell, starting from the lowest level, and this takes a longer time than the single programming pulse used in the case of two-level cells. In addition, each level is attained only after the setting of the level directly below.

In order to achieve a programming time of the single byte that can be compared with that of a conventional two-level cell, it has been thought of programming several multi-level cells in parallel.

Assuming 8 µs to be the time taken to program a single byte in the two-level case, and 200 µs to be the time taken to go through the stepwise program ramp in the multi-level case, then 256 bits of multi-level cells would have to be programmed simultaneously in order to achieve an effective programming time of 6 µs per each single byte of multi-level cells.

Increasing the internal parallelism of multi-level memory devices would bring about several technical problems, first and foremost increased current usage, to the point that any engineering developments in that direction would be restrained.

As an alternative to the previous solution it has been proposed to write a multi-level non-volatile memory device comprising a plurality of transistor cells grouped into memory words and provided with conventional gate and drain terminals by different drain voltage values applied in parallel to separate cells for attaining different threshold values.

This solution is disclosed for instance in the U.S. Pat. No. 5,796,652 assigned to NEC which discloses a memory cell array including first and second writing circuits generating first and second writing voltages having a level corresponding to the value of first and second quaternary input data.

So, two items of quaternary data can be simultaneously written into two multi-level memory cells of one memory row selected by one word line.

The principle of operation for writing multivalue information into the memory cells is disclosed with reference to FIG. 9 of the NEC patent. The gate of each selected memory cell transistor receives a negative writing voltage while the drain of the same transistor receives one of the available four voltages corresponding to the desired threshold voltages.

However, as shown in FIG. 10 of that patent, the writing bit line voltages are applied for a programming time Tp that is difficult to control and will not be able to reach always the target values without overlapping with or getting closer to different logic values of the cell.

Moreover, the circuit structure for applying the require writing voltages is very complex and uses a couple of switch transistors for each bit line to bias.

Similar solutions are disclosed also in the U.S. Pat. No. 5,708,600 and in the U.S. Pat. No. 5.970,012, both of which are incorporated herein in their entireties. Both solution, however, fail to reach efficient programming results in reasonable times of with writing circuit of reduced complexity.

BRIEF SUMMARY OF THE INVENTION

An embodiment of this invention provides a new method of programming the cells of a multi-level non-volatile memory device, which method has appropriate operational features to enable programming to be performed faster than, yet as accurately as, the programming methods of the prior art and by writing circuit portions requiring a reduced number of circuit components.

The method applies, to the drain terminals of the cells of a given memory word to be programmed, different voltage values as a function of the threshold to be attained. The different drain voltages, each corresponding to a predetermined level, are selected to promote the attainment of the corresponding level in a seeking-to or asymptotic way, i.e. after a congruous number of pulses, regardless of the final level of each bit.

The different drain voltage values are directly proportional to the threshold values to be attained for each bit, and are selected such that the corresponding level set for each bit is attained in a seeking-to or asymptotic manner at the end of a congruous number of pulses.

Of course, to obtain bits of equal level, the same drain voltage values have to be applied.

The congruous number of pulses is to meet two requirements: it should be the least possible, and at the same time, ensure that each level is attained with an appropriate degree of suitable and controlled accuracy.

The features and advantages of the programming method according to this invention will become apparent from the following description of an embodiment thereof, given by way of non-limitative example with reference to the accompanying drawings.

BRIEF DESCRIPTION OF THE SEVERAL VIEWS OF THE DRAWINGS

In the drawings:

FIGS. 5A and 5B schematically show voltage vs. time plots respectively showing two different characteristic curves associated with a predetermined logic level that vary depending on the number of pulses applied to the drain terminals of the memory cells; and FIGS. 6A and 6B schematically show voltage vs. time plots respectively showing two different characteristic curves associated with a predetermined logic level and that vary depending on the number of pulses applied to the drain terminals of the memory cells;

DETAILED DESCRIPTION OF THE INVENTION

Figure 1:
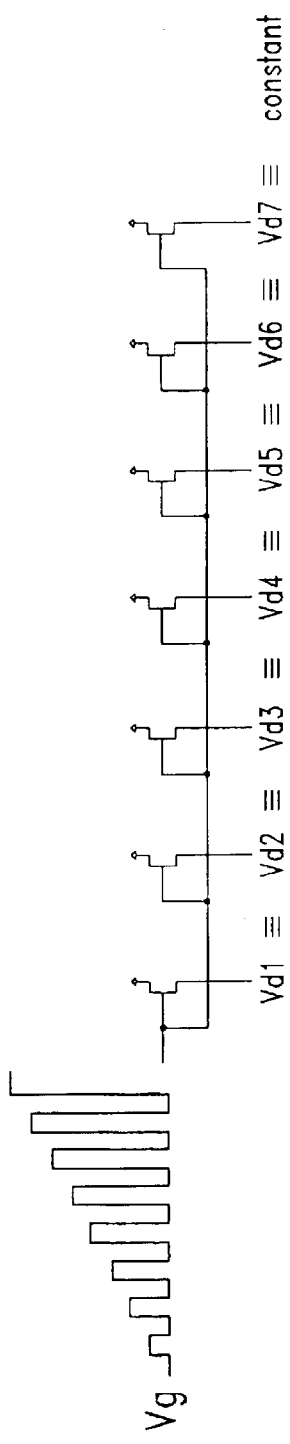
FIG. 1 schematically shows schematically a series of multi-level memory cells and a plot of a programming voltage to be applied to the cell control gate terminals, according to the prior art.
Figure 2:
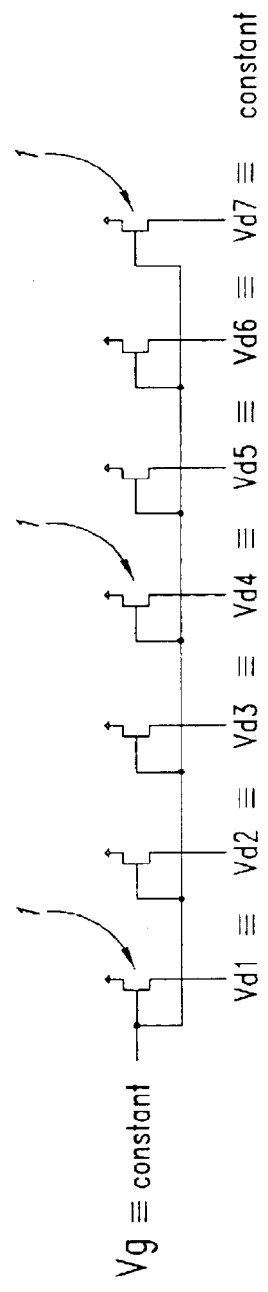
FIG. 2 schematically shows the same series of multi-level memory cells as in FIG. 1, and a plot of a programming voltage to be applied to the cell drain terminals, according to this invention.

With reference to the drawings, in particular to FIG. 2 thereof, a group of memory cells, being incorporated in a multi-level non-volatile memory device monolithically integrated in a semiconductor, are shown generally at 1 in schematic form.

The memory device is a conventional one, and accordingly shown in the drawings as a whole. It comprises an array of multi-level memory cells along with its address, decode, read, write, and erase circuitry. Thus, shown in FIG. 2 is just an eight-bit memory word or byte.

However, there is no reason why larger memory words, e.g. words of sixteen, thirty-two, or sixty-four bits, could not be considered instead. The following considerations bear no relation to the size of the memory word.

The memory device where the cells 1 are incorporated may be of the EEPROM or of the flash EEPROM, and is electrically programmable and erasable.

As previously stated, the array of non-volatile memory cells has conventional decode circuitry associated therewith, which circuitry is triggered by a switching edge of a pulsive signal (ATD) signal.

A typical architecture of a non-volatile memory array comprises a number of sectors divided into two groups. Each sector can be programmed and erased independently of the other sectors. Furthermore, each group has its own row decode, and its own array of read sense amplifiers.

A more detailed description of the construction and operation of a multi-level memory device can be found in the technical literature. For the purpose of this invention, it is important to understand that, in a multi-level memory device, the duration of the programming pulse and the voltage applied to the drain terminal of the memory cell are critical parameters to successful programming.

In conventional programming of the stepwise type, carried out according to the prior art, a memory cell typically draws a current of several tens of $\mu A$. For example, assuming a current draw of 50 $\mu A$ per cell, programming or modifying 64 cells in parallel would require a total program current of 3.2 mA.

The method of the invention allows the current requirements for programming to be drastically reduced, and allows much faster programming.

With reference in particular to the example shown in FIG. 2, the control gate terminals of the memory cells 1 that comprise the memory word are all held at the same constant voltage value Vg.

At the same time, to the drain terminal of each memory cell of a word is applied a drain voltage that is a direct function of the threshold level sought to be reached for a predetermined bit. The voltage values to be applied to the drain terminal, say four different values for four different levels (Vdie{Vd_11(0), Vd_10(min), Vd_01(med), Vd_00(high)), are purposely selected from an indefinite set of possible values, such that the target condition can be simultaneously attained, regardless of the values of the levels. This is achieved with a limited, albeit exactly congruous, number of pulses, which are followed by a testing phase.

This is made practicable by the drain levels being designed to produce larger variations at higher levels, such that they can attain a respective level each at the end of a convenient number of pulses.

In this way, a different final threshold voltage can be obtained for each cell at the very instant of time when programming is discontinued.

Figure 7:
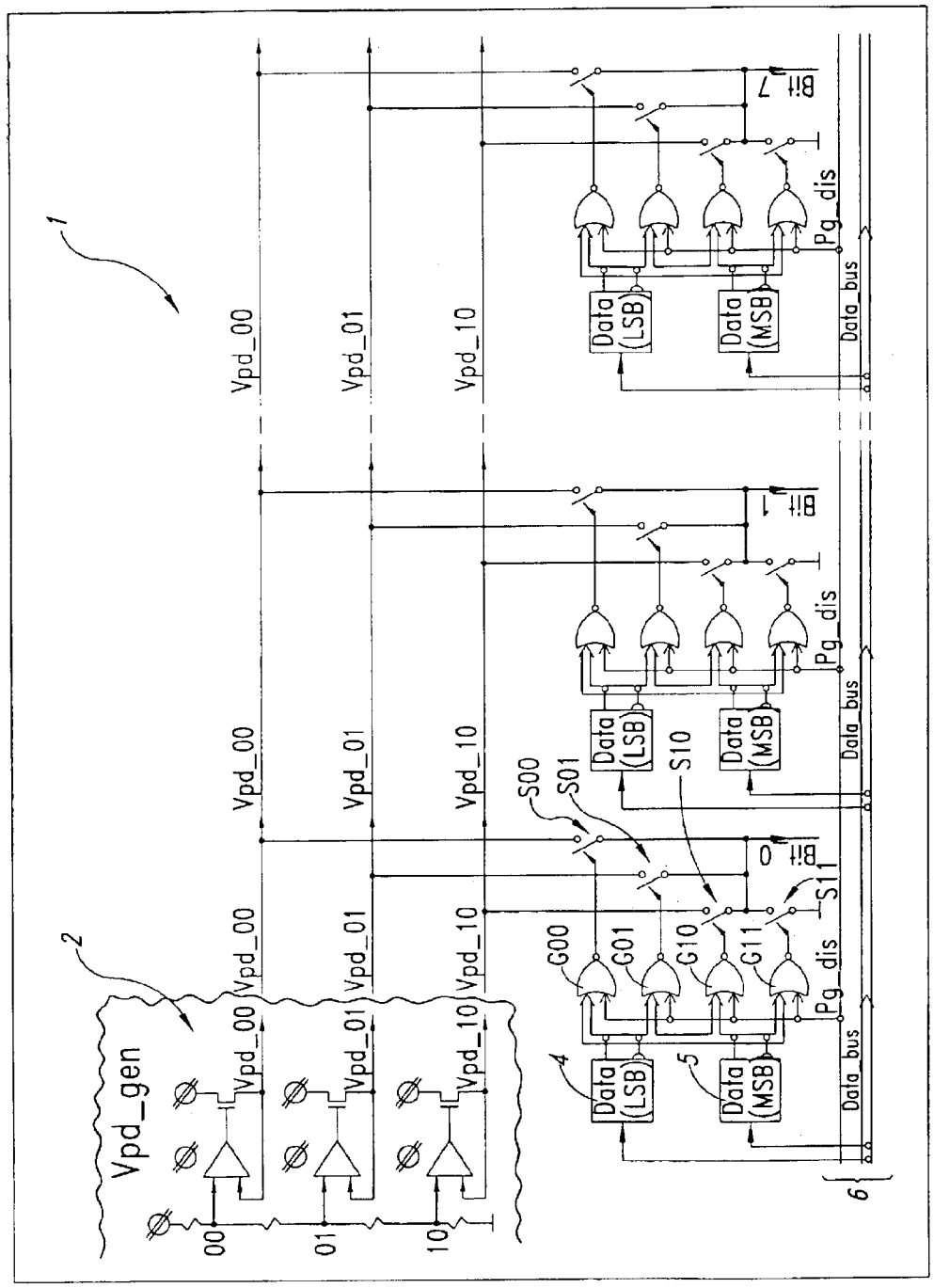
FIG. 7 is a schematic view of a writing circuit portion incorporated into a memory device of the present invention.

A writing circuit portion 10 for programming the multi-level memory cells according to the present invention is shown in FIG. 7.

This circuit portion 10 includes a voltage generator 2 providing for instance three different output voltage values, each corresponding to a logic level to be programmed in the memory cells, i.e. the logic level 00, 01 and 10. A fourth reference voltage is obtained from the ground voltage reference for the logic level The voltage generator 2 includes three independent voltage regulators each providing on an output line a predetermined output voltage level.

In more general terms it may be appreciated that the output lines of the voltage generator 2 are n−1 where n is the number of levels of each multi-level memory cell.

The voltage regulators of the voltage generator 2 are supplied by a stable voltage reference, for instance a bandgap voltage reference.

According to an embodiment of the present invention each bit line Bit_0, Bit_1, . . . , Bit_7 of a memory word is connected to the outputs of the voltage generator 2 through a corresponding switch S00, S01, S10 and S11.

Each switch is driven by the output of a corresponding logic gate G00, G01, G10 and G11.

Those logic gates present two inputs, one connected to a disabling line Pg_dis and the other receiving a signal from the output of a data block. More particularly, a first data block (Data (LSB)) 4 for the less significant bit is coupled to the first gates G00 and G01, while a second data block (Data (LSB)) 5 for the most significant bits is coupled to the other gates G10 and G11.

Each data block is input connected to a Data_bus 6 receiving the input data to be written into the memory cells.

As may be appreciated, just a single switch for each bit line is enabled by the corresponding logic gate to bias the bit line of the memory array with the right voltage value provided by the voltage generator (Vpd_gen) 2.

According to the selection performed by the data blocks 4 and 5, one of the logic gates G00, G01, G10 and G11 is enabled to drive the corresponding switch thus connecting the selected bit line with the output voltage line.

In case of larger memory words, e.g. words of sixteen, thirty-two, or sixty-four bits, all of the bit lines may be coupled to the same output lines above disclosed. In this manner a large word including more than one byte can be simultaneously configured under control of the data blocks 4 and 5 for a larger parallel programming but using always the same output lines of the voltage regulator 2.

So, the writing circuit portion 10 provides n−1 different drain voltages produced by dedicated voltage regulators. Each voltage regulator can be simultaneously applied to many different drain terminals having the same voltage level to be reached.

Figure 3:
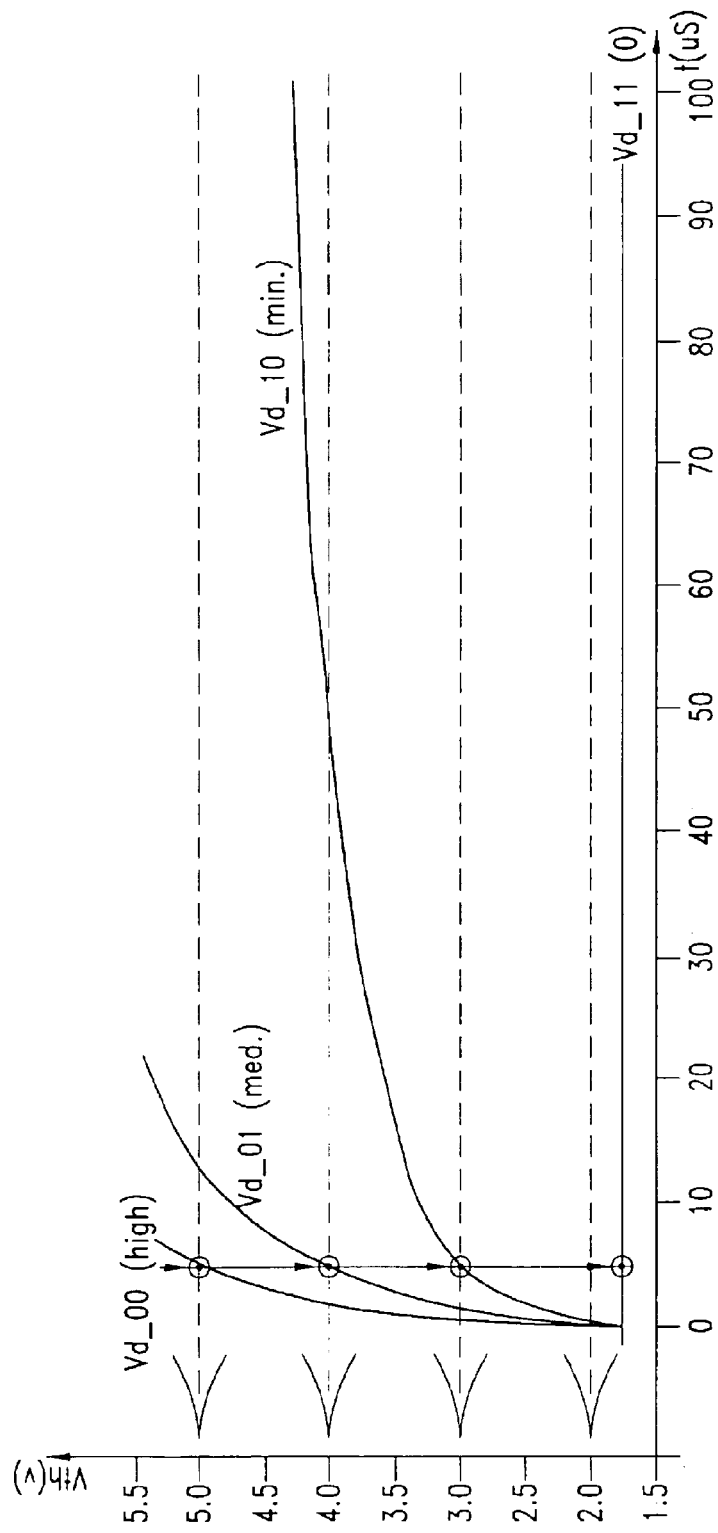
FIG. 3 schematically shows a plot of voltage against time showing certain characteristic curves that correspond to different threshold levels of the memory cells.

The aspects of the invention can be better appreciated by having reference to the graph of voltage ($V_t$) vs. time (t) in FIG. 3.

The graph shows curves of measurements made by the Applicant on electrically programmable/erasable multi-level non-volatile cells.

The curves show that the write characteristic of the cells varies with time and the value of the drain voltage at a constant gate voltage, e.g. of 9 V.

The cell threshold increases with time and according to the end level sought, while at a predetermined instant of time, it takes a value that corresponds to the drain voltage applied.

Preferably, the desired cell thresholds or logic levels are attained in a "seeking-to" or asymptotic manner using a plurality of voltage pulses on the drain terminals of the cells being programmed. Such a "seeking-to" manner refers to the step-wise fashion in which the desired cell thresholds are obtained by pulsing the drain terminals of the cells being programmed.

In essence, after a predetermined period of time, the threshold voltage of a given cell held at a constant control gate voltage will have a threshold value that is tightly linked to the voltage applied to its drain terminal. The higher this voltage value, the higher will be the corresponding threshold. The drain voltage values (Vd1–Vd7 FIG. 2) are selected such that the different levels will be attained simultaneously after n congruously accurate pulses, whose number may be a bare minimum.

Of course, the minimum number of preceding pulses is tightly linked to the degree of accuracy sought. However, by paralleling the levels in this manner, some more pulses can be expended to enhance the degree of accuracy, with the inventive method providing the dual advantage of being faster and more accurate than traditional approaches.

Consequently, the method of this invention essentially dissociates the memory cell programming time from a target threshold level.

In conventional stepwise programming methods, programming time is a linear function of the level to which a given cell is to be raised, and many pulses are expended to just move from one level to another, with an attendant waste of time.

In addition, as the plot of FIG. 3 brings out, attaining a given threshold level in a non-linear, or rather logarithmic fashion versus time is assurance of the threshold levels, and hence the corresponding logic levels, being neatly separated. In essence, the possibility for levels to overlap is drastically lessened.

A noteworthy feature of the programming method is that to the drain terminals of the cells are applied successive voltage pulses of predetermined duration, e.g. 1 μs, and of a level same as the level sought. However, there is no reason why successive pulses of different duration could not be used instead, e.g. a first pulse of long duration followed by one or more pulses of shorter or decreasing duration, in order to advantageously speed up the starting step and further reduce the number of pulses and attendant verify step.

The voltage/time graph of FIG. 5A shows, by way of example, two characteristic curves illustrating how the attainable threshold values may vary for the same applied voltage values but with a different number of pulses.

Figure 4A:
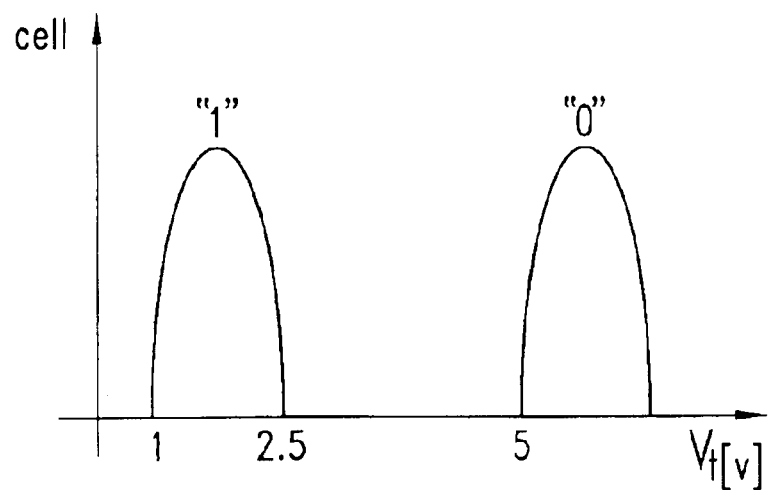
FIGS. 4A and 4B are comparative of the threshold voltage distribution, in a two-level memory and a multi-level memory having two bits per cell.
Figure 4B:
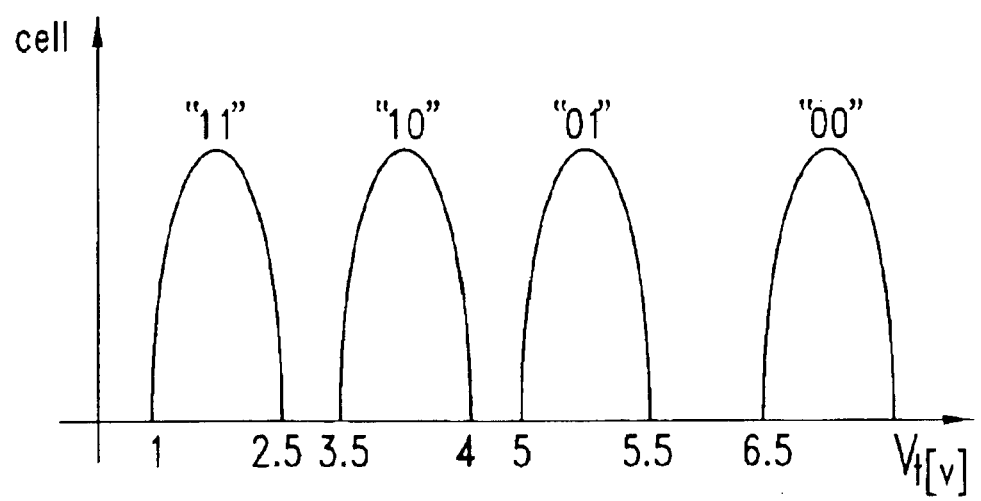

The voltage/time graph of FIG. 5B is another example obtained at a different drain voltage level if compared with the graph of FIG. 4A.

The graphs of FIGS. 6A and 6B are similar to those of FIGS. 5A and 5B, but for the number of pulses that are applied in order to attain a predetermined threshold.

The number of pulses that can be applied to the drain terminal may vary contingent on the cell fabrication process, and can be adjusted according to the results of conventional program verify tests.

The method described above does brilliantly solve problems of the prior art, and provides a number of advantages, foremost among which is that the number of pulses, and with it the memory word programming time, has been greatly reduced if compared with conventional methods.

Simulation tests conducted by the Applicant have demonstrated time savings of up to one order of magnitude over gate pulse writing.

The solution proposed by the present invention outdates the parallelism techniques.

An additional advantage comes from the reduced stress on the gates of the memory cells. In the state of the art, one is to wait for all the cells of a byte to be written before a memory address can be changed, which highly stresses the gate terminals with the application of the whole stepwise ramp of voltage values. On the other hand, the amount of stress on the gate terminals is reduced in this invention, again of one order of magnitude.

Finally, it will be appreciated that, in this invention, the drain terminals of the cells to be programmed are brought up to a desired regulated voltage value, regardless of the number of cells that are to be programmed.

The programming method of this invention can also be advantageously applied to high-capacity memory devices having special functions (such as the burst mode or page mode) and including a large number of sense amplifiers arranged for sharing by the whole memory array.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety. From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for programming a non-volatile memory device of the multi-level type that includes a plurality of transistor cells grouped into memory words and each provided with gate and drain terminals, the method comprising applying different drain voltage values in parallel to separate cells for attaining different threshold values, wherein said different drain voltage values are directly proportional to threshold values to be attained for each bit being programmed into the cells, and are selected such that the corresponding level set for each bit is attained in a seeking-to or an asymptotic manner at an end of a congruous number of pulses.

2. A programming method according to claim 1, wherein a constant gate voltage value is concurrently applied to the gate terminals of said cells.

3. A programming method according to claim 1, wherein each different drain voltage value is applied by a succession of pulses.

4. A programming method according to claim 3, wherein the different drain voltages have a constant amplitude or level at each pulse.

5. A programming method according to claim 3, wherein said pulses are constant duration pulses.

6. A programming method according to claim 3, wherein said pulses are decreasing duration pulses.

7. A programming method according to claim 3, wherein said pulses are varying duration pulses.

8. A programming method according to claim 1, wherein the different drain voltage values correspond to different logic threshold values of the multi-level cells.

9. A programming method according to claim 1, wherein said different drain voltage values are appropriate to ensure that a predetermined threshold level will be attained in a seeking-to manner, at the end of a predetermined number of pulses.

10. A programming method according to claim 1, wherein said cells of said memory word take a different individual threshold value in a seeking-to manner, at a same instant of time when programming is interrupted.

11. A programming method according to claim 1, wherein a cell programming time for programming the cells is unrelated to the threshold level sought.

12. A programming method according to claim 1, wherein a point of simultaneous attainment in a seeking-to manner of the different target levels is set at an end of a limited number of pulses.

13. A programming method according to claim 12, wherein the limited number of pulses is set consistently with a congruous degree of accuracy and with a number tending to a minimum.

14. A programming method according to claim 1, wherein each drain voltage value is generated by a different and corresponding voltage regulator; the number of regulators being n–1 where n is the number of levels of the multi-level cells.

15. A programming method for a multi-level non-volatile memory device having a plurality of transistor cells grouped into memory words and each provided with gate and drain terminals, the method comprising:

applying different drain voltage values in parallel to different cells for reaching different threshold values;

said different drain voltage values being directly proportional to the threshold values to be reached on each cell;

said different drain voltage values being applied by a succession of pulses and selected so that a corresponding logic level of each cell is attained at the end of a predetermined number of said pulses.

16. A programming method according to claim 15, wherein a constant gate voltage value is concurrently applied to the gate terminals of said cells.

17. A programming method according to claim 15, wherein each different drain voltage value has a constant amplitude at each pulse.

18. A programming method according to claim 15, wherein said pulses are constant duration pulses.

19. A programming method according to claim 15, wherein said pulses are decreasing duration pulses.

20. A programming method according to claim 15, wherein said pulses are varying duration pulses.

21. A programming method according to claim 15, wherein the different drain voltage values correspond to different logic threshold values of the cells.

22. A programming method according to claim 15, wherein said different drain voltage values are appropriate to ensure that a predetermined threshold level will be attained in a seeking-to manner, at the end of a predetermined number of pulses.

23. A programming method according to claim 15, wherein some cells of said memory word take a different individual threshold value in a seeking-to manner, at a same instant of time when programming is interrupted.

24. A programming method according to claim 15, wherein a cell programming time for programming the cells is unrelated to the threshold level sought.

25. A programming method according to claim 15, wherein a point of simultaneous attainment in a seeking-to manner of the different logic levels is set at the end of a limited number of pulses.

26. A programming method according to claim 25, wherein the limited number of pulses is set consistently with a congruous degree of accuracy and with a number tending to a minimum.

27. A writing circuit for programming a multi-level non-volatile memory device having a plurality of transistor cells grouped into memory words and provided with gate and drain terminals, said the writing circuit comprising:

a voltage generator producing respectively at plural output lines a plurality of output voltages corresponding respectively to plural logic levels to be programmed on said cells;

a plurality of switches connecting a bit line of the memory device with the output lines, respectively, of said voltage generator; and a plurality of logic gates for driving the switches, respectively; the logic gates corresponding to the logic level to be programmed and being enabled by a data block coupled to a data bus.

28. A writing circuit portion according to claim 27, wherein said output voltages are produced by corresponding n–1 voltage regulators, where n is the number of logic levels of the cells.

29. A writing circuit portion according to claim 28, wherein each voltage regulator can be coupled simultaneously to different drain terminals having the same level to be reached.

30. A writing circuit portion according to claim 29, wherein said voltage regulators are incorporated into said voltage generator.

* * * * *